United States Patent
Nicolas et al.

(10) Patent No.: US 9,601,457 B2
(45) Date of Patent: Mar. 21, 2017

(54) METHOD FOR MAKING AN ELECTRICAL CONNECTION IN A BLIND VIA AND ELECTRICAL CONNECTION OBTAINED

(71) Applicant: Commissariat a l'energie atomique et aux energies alternatives, Paris (FR)

(72) Inventors: Stephane Nicolas, Meylan (FR); Stephane Fanget, Le Grand Lemps (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/939,283

(22) Filed: Nov. 12, 2015

(65) Prior Publication Data

US 2016/0172325 A1 Jun. 16, 2016

(30) Foreign Application Priority Data

Dec. 12, 2014 (FR) ..................................... 14 62341

(51) Int. Cl.
| | | |
|---|---|---|
| *H01L 23/00* | (2006.01) | |
| *H01L 21/768* | (2006.01) | |
| *B81C 1/00* | (2006.01) | |
| *H01L 23/498* | (2006.01) | |

(52) U.S. Cl.
CPC .......... *H01L 24/75* (2013.01); *B81C 1/00238* (2013.01); *H01L 21/768* (2013.01); *H01L 23/49816* (2013.01); *B81C 2203/0792* (2013.01)

(58) Field of Classification Search
None
See application file for complete search history.

(56) References Cited

U.S. PATENT DOCUMENTS

| | | | |
|---|---|---|---|
| 6,137,062 A | 10/2000 | Zimmerman | |
| 7,008,817 B2 | 3/2006 | Kim et al. | |
| 7,838,393 B2 | 11/2010 | Collet et al. | |
| 8,704,368 B1 | 4/2014 | Yoshida et al. | |
| 2002/0008311 A1 | 1/2002 | Kimura | |
| 2006/0284299 A1* | 12/2006 | Karnezos | H01L 23/3128 257/686 |
| 2010/0072600 A1 | 3/2010 | Gerber | |
| 2011/0027930 A1* | 2/2011 | El-Gamal | B81C 1/00301 438/51 |

(Continued)

FOREIGN PATENT DOCUMENTS

EP  1 022 774 A2  7/2000

OTHER PUBLICATIONS

French Preliminary Search Report issued May 28, 2015 in French Application 14 62341, filed on Dec. 12, 2014 (with English Translation of Categories of Cited Documents).

*Primary Examiner* — Khaja Ahmad
(74) *Attorney, Agent, or Firm* — Oblon, McClelland, Maier & Neustadt, L.L.P.

(57) ABSTRACT

Method comprising steps as follows:
  a) depositing a meltable ball on a first conducting zone located in a blind hole formed on a first face of a first support,
  b) assembling the first support with a second support by transfer of the meltable ball on a second conducting zone, the transfer also being made by thermo-compression so as to compress the ball, the compressed ball being held at a distance from the side walls of the blind hole.

9 Claims, 4 Drawing Sheets

(56) References Cited

U.S. PATENT DOCUMENTS

| | | | |
|---|---|---|---|
| 2012/0241950 A1* | 9/2012 | Takahashi | H01L 21/561 257/737 |
| 2012/0306075 A1* | 12/2012 | Kim | H01L 25/105 257/738 |
| 2013/0069228 A1 | 3/2013 | Liu et al. | |
| 2013/0113108 A1* | 5/2013 | Wang | H01L 24/97 257/772 |
| 2013/0133936 A1* | 5/2013 | Yorita | H05K 1/09 174/257 |
| 2014/0177881 A1 | 6/2014 | Fanget et al. | |
| 2014/0353821 A1* | 12/2014 | Yu | H01L 24/17 257/737 |

\* cited by examiner

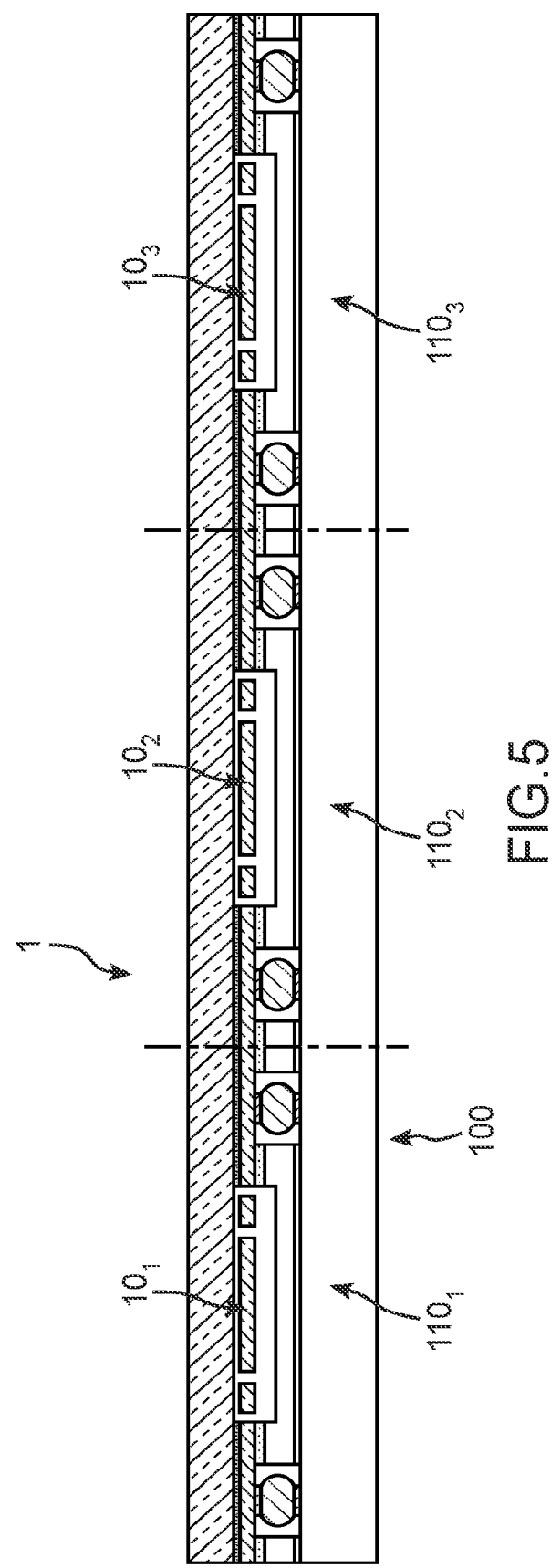

METHOD FOR MAKING AN ELECTRICAL CONNECTION IN A BLIND VIA AND ELECTRICAL CONNECTION OBTAINED

TECHNICAL DOMAIN

This invention relates to the field of microelectronics and more particularly assembly and connection of electronic components through meltable conducting balls.

It is more particularly applicable to the assembly and connection of a MEMS (MicroElectroMechanical System) and/or a NEMS (NanoElectroMechanical System) component with another electronic element or device.

PRIOR ART

There are two principle ways of electrically connecting microelectronic components to each other, namely <<wire bonding>> type connection techniques and <<flip-chip>> connection techniques.

The flip-chip technique consists of electrically connecting components through metal structures in the form of balls arranged on pads of one of the components.

This solution has the advantage that the resulting assembly is compact because the components are usually stacked.

The electrical connection made also has good electrical performances, the contact length being shorter than in the case of wire-bonding connections.

Document U.S. Pat. No. 8,704,368 B1 discloses an assembly between a first support and a second support, the first support comprising meltable conducting balls located in blind via holes and that are then transferred onto contact zones. The assembly disclosed in this document is arranged such that a space is kept between the first support and the second support.

Document U.S. Pat. No. 6,137,062 B1 also discloses an assembly between two supports using meltable balls.

A precise control over compression of the balls cannot be obtained with such methods.

Secondly, the assembly is made so that a ball is placed on each of the two supports. If the diameter of the balls is not uniform, some balls on the first support will not be in physical contact with the facing balls on the second support, which could cause defective electrical contact.

Consequently, there is a need to make an assembly in which the disadvantages mentioned above are reduced.

PRESENTATION OF THE INVENTION

According to one embodiment, the present invention relates to a method for making a structure comprising steps consisting of the following:

a) deposit a meltable ball on a first conducting zone located at the bottom of a blind hole formed on a first face of a first support, the blind hole being delimited by the bottom, one or several side walls, and an opening, the meltable ball having appropriate dimensions relative to the dimensions of the blind hole such that the deposited meltable ball projects above the opening of the blind hole and is located at a distance from the side walls of the blind hole, b) assemble the first support with a second support by transferring the meltable ball onto a second conducting zone located on a first face of the second support, the transfer being made such that the first face of the second support is located at the opening of the blind hole, the transfer being made so as to compress the meltable ball, the dimensions of the ball being adapted to the dimensions of the blind hole such that once the first face of the second support is located at the opening of the blind hole, the compressed ball is held at a distance from the side walls of the blind hole.

This invention can also be used to make an interconnection structure that is specific in that it is compact, the ball being held in place in the blind hole and not occupying any additional space in the final assembly.

In particular, the fact that the ball is kept at a distance from the side walls of the blind hole limits mechanical stresses in the final assembly.

During and after the assembly step in step b), the first and the second supports can deform under the influence of a temperature variation. Keeping an empty space between the balls and the walls enables deformation with low or no stress.

The fact of keeping a space between the ball and the side walls of the blind hole also avoids electrical contact between the side walls and the conducting ball.

Another advantage of this invention is that it provides a connection with fewer manufacturing steps and a lower cost than existing TSV (Through Silicon Via) and TGV (Through Glass Via) type interconnection technologies.

In this method, bringing the first face of the second support into contact at the opening of the blind hole enables control of compression of the balls.

The assembly may be made by thermocompression. Thus, the assembly may be made at a temperature that at least partially melts the ball. Furthermore, the application of a mechanical pressure, for example using a sealing machine for sealing supports to each other facilitates compression of the ball(s) in the blind hole. Each blind hole may comprise one or several distinct conducting zones. Preferably, a single ball is deposited for each conducting zone. The distances Δ and Δ' are not necessarily constant all around the ball particularly when there are several balls in a single blind hole.

According to one possible embodiment of the method, the bottom of the blind hole may be partially covered by the first conducting zone, the first conducting zone not being in contact with the side walls of the blind hole. In one case particularly in which the walls of the blind hole are conducting, it is required to prevent contact with the walls.

This arrangement also makes it possible to keep the conducting ball at a distance from the walls of the hole.

According to one possible embodiment, the blind hole may be provided with at least one conducting wall. The above-mentioned arrangement can also assure that the conducting ball is kept at a distance from the conducting wall of the hole.

According to one possible embodiment of the method, the first support comprises at least one electromechanical microsystem.

According to one possible embodiment of the method, the first face of the first support may comprise an encapsulation cap for the microelectromechanical system.

According to one possible embodiment of the method, the second support may comprise an ASIC (Application Specific Integrated Circuit).

According to one possible embodiment of the method, a stress attenuation layer may be formed in step b) between the first support and the second support. This limits the impact of stresses due to thermocompression on the final assembly. Degradation of metallic materials by corrosion due to the presence of oxygen in the atmosphere is also limited by encapsulating contact zones with a gas-tight layer.

The attenuation layer is advantageously made on the support with the least relief or roughness.

This stress attenuation layer may be formed on the second support before step b).

According to one possible embodiment of the method, the assembly of the first and second supports may be cut into several elements after step b).

BRIEF DESCRIPTION OF THE DRAWINGS

This invention will be better understood after reading the description of example embodiments given purely for information and in no way limitative with reference to the appended drawings on which:

FIG. 5 shows a step in which the structure formed from the assembly between the first support and the second support is cut into several elements;

Identical, similar or equivalent parts of the different figures described below have the same numeric references to facilitate comparison between the different figures.

The different parts shown in the figures are not necessarily all at the same scale, to make the figures more easily understandable.

The various possibilities (variants and embodiments) should be understood as not being exclusive of each other, and they can be combined with each other.

Furthermore in the following description, terms that depend on the orientation of the structure such as <<on>>, <<at the bottom>>, <<upper>>, should be used considering that the structure is oriented as shown in the figures.

DETAILED PRESENTATION OF PARTICULAR EMBODIMENTS

Figure 1A:
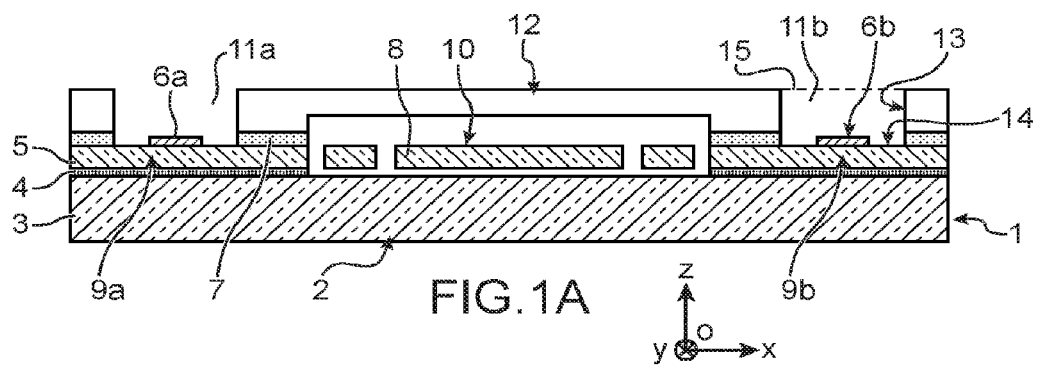
FIGS. 1A-1D show an example of the assembly method between a first support and a second support that can be used to interconnect the first support and the second support using conducting balls.

Refer firstly to FIG. 1A that shows a first support 1 formed from a first substrate 2 in which a MEMS (MicroElectro-Mechanical System) component 10 is made.

This component 10 comprises at least one structure 8 with at least one degree of freedom and one or several electrodes 9a, 9b to detect displacement of the structure 8 and/or actuation of the structure 8 and on which conducting contact zones 6a, 6b respectively are formed.

The substrate 2 may be made semiconducting and for example made of silicon.

Advantageously, the substrate 2 is a semiconducting or insulating type substrate, for example SOI (Silicon On Insulator) or Bonded SOI type substrate comprising a semiconducting support layer 3, an insulating layer 4 formed on and in contact with the semiconducting support layer 3 and a superficial semiconducting layer 5 formed on and in contact with the insulating layer. In this case, the structure 8 and the electrodes 9a, 9b may be at least partially formed in the superficial semiconducting layer. This superficial semiconducting layer 5 may be less than 1 μm thick in the case of an SOI substrate or it may be between 1 μm and 100 μm in the case of a Bonded SOI type substrate.

The first support 1 also comprises a second substrate 12 assembled to the first substrate 2 and forms a cap covering the MEMS component 10. The second substrate 12 may for example be made from silicon or glass and it may be assembled to the first substrate 1 directly or for example through a sealing bead 7 that may for example be made from polymer, sintered glass or one or several metallic materials. In the case of a glass substrate 12 and a silicon substrate 2, the two substrates can be assembled by anodic bonding. If the two substrates 2 and 12 are made of silicon, they can be assembled by molecular bonding.

Assembly of the second substrate 12 and the first substrate 2 forms a cavity inside which the sensitive structure of the MEMS component is placed. This cavity may possibly be closed. Blind holes 11a, 11b are provided in the first support 1 and expose conducting contact zones 6a, 6b respectively. The holes 11a, 11b may pass through the second substrate 12 and have a bottom 14 that extends parallel to a main plane of the first support 1 and exposes the electrodes 9a, 9b. <<Main plane>> of the first support 1 refers to a plane that passes through the first support 1 and that is parallel to the [O; x; y] plane of the [O; x; y; z] orthogonal coordinate system in FIG. 1A.

Each conducting contact zone 6a (and 6b) is formed on a region of the bottom 14 of a blind hole 11a (and 11b) and partially covers this bottom 14. The conducting contact zones 6a, 6b are formed at a non-zero distance from the side walls 13 of the hole. Side walls 13 of holes 11a, 11b means walls that extend between the bottom 14 and the opening 15 of the holes. The side walls 13 extend along a direction making a non-zero angle with the main plane of the first support 1. The side walls 13 may be vertical and for example may extend as shown in the example in FIG. 1A parallel to the vector z of the orthogonal coordinate system [O; x; y; z]. The conducting contact zones 6a, 6b may be made from a metallic material based on one or several materials among Cr, Ni, Ti, Cu, Al, and Au.

Figure 1B:
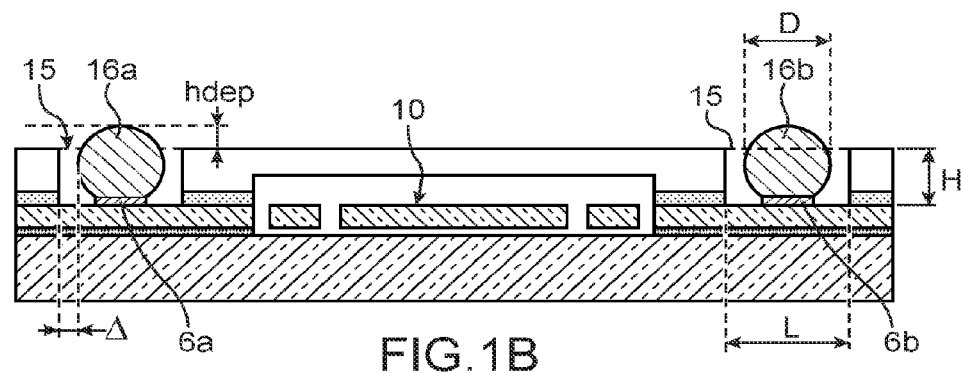

Starting from the structure that has just been disclosed with reference to FIG. 1A, meltable balls 16a, 16b (also called "solder balls") made from a metallic material may then be deposited on the conducting contact zones 6a, 6b (FIG. 1B).

For example, this step may be performed using a ball transfer technique commonly called laser-assisted solder jetting, as described for example in document <<*Solder Jetting—A Versatile Packaging and Assembly Technology for Hybrid Photonics and Optoelectronical Systems*>> IMAPS 42$^{nd}$ International Symposium on Microelectronics, Volume: Proceedings of the IMAPS 42nd International Symposium on Microelectronics.

Such a method can be used to place balls 16a, 16b precisely by soldering the balls on the contact zones 6a, 6b using a laser. The balls 16a, 16b may for example be made from one or several metallic materials chosen from among Sn, Pb, Ag, Au, Cu, In. The balls 16a, 16b may be made from a metal alloy chosen for example from among the SnPb, AuSn, SnAgCu, InPb, AgSn, AgSnPb, InSnPb alloys.

The dimensions of the balls 16a, 16b are chosen relative to the dimensions of the blind holes 11a, 11b such that the balls 16a, 16b project beyond the opening 15 of the blind holes 11a, 11b in this example located at a top face of the first support 1. Thus, when the balls 16a, 16b are spherical or approximately spherical in shape, their diameter D can be larger than the height H of the blind holes 11a, 11b measured parallel to the vector z of the orthogonal coordinate system [O; x; y; z] in FIG. 1B. The meltable balls 16a, 16b may for example have a diameter D between 0.05 mm and 1 mm. For example, the height H of the blind holes 11a, 11b may be between 0.04 and 1 mm.

The blind holes 11 may also have a critical dimension L also called diameter L for example between 0.06 and 1 mm. The <<critical dimension>> in this description refers to the smallest dimension of a pattern apart from its thickness. In the example in FIG. 1B, the diameter L of the holes is measured in an [O; x; y] plane in the [O; x; y; z] orthogonal coordinate system.

The dimensions of the balls 16a, 16b may also be chosen relative to the dimensions of the holes 11a, 11b such that the balls 16a, 16b are located at a non-zero distance Δ from the side walls 13 of the blind holes 11a, 11b and are not in contact with these walls. The distance Δ may for example be between 10 and 100 μm.

The dimensions of the balls 16a, 16b may also be chosen relative to the dimensions of the holes 11a, 11b such that the height hdep by which the balls 16a, 16b project measured between a zone of the balls located at the opening of the blind holes and the top of the balls 16 may for example be between 10 μm and 100 μm.

Figure 1C:
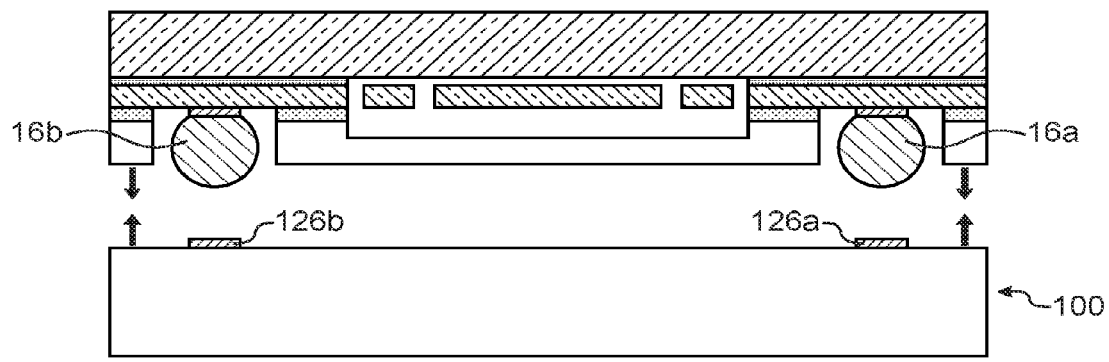
Figure 1D:
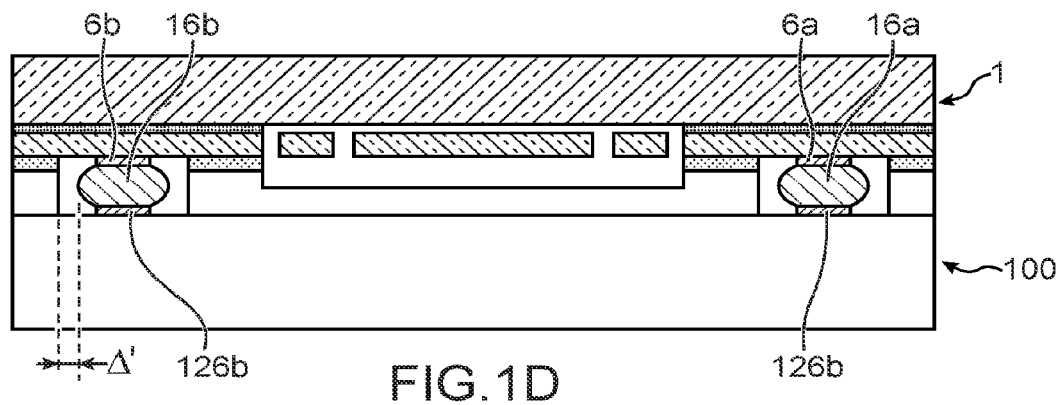

A structure made in this way can then be assembled with a second support 100 comprising a third substrate, for example on which a special ASIC electronic circuit is installed (FIGS. 1C-1D).

To enable precise alignment of the two supports 1 and 100, <<bond aligner>> type equipment may be used prior to assembly to obtain an alignment precision of the order of one micron. The assembly is then made by thermo-compression, for example in <<wafer bonder>> type equipment that can increase the temperature of the assembled structure enough to melt the conducting balls while applying a controlled force, for example between 0.5 kN and 90 kN to compress the meltable balls 16a, 16b onto the conducting pads 126a, 126b of the second support 100. The conducting pads 126a, 126b form second conducting contact zones. Thus, an electrical connection is made between the first conducting contact zones and the second conducting contact zones.

Assembly is made by thermo-compression so as to compress the meltable balls 16a, 16b and reduce their height.

The dimensions of the meltable balls 16a, 16b and particularly their diameter D, are adapted to the dimensions of the blind holes 11, and particularly their diameter L such that when the balls 16a, 16b are at their maximum compression during thermocompression, they remain at a non-zero distance Δ' from the side walls 12 of the blind holes 11. At the end of the thermocompression step, the balls 16a, 16b are thus not in contact with the walls 12 of the blind holes 11a, 11b. This thus prevents the balls from bearing in contact with the walls 12 of the holes. Electrical contact is also avoided if one or several side walls 12 of the blind holes 11a, 11b are made from a conducting material.

The temperature to which the balls 16a, 16b are brought during thermocompression is selected to be higher than the melting temperature of the material or the material alloy from which the balls 16a, 16b are made and may for example be between 90° C. and 300° C.

For example, when the meltable balls 16a, 16b are made from SnPb, the melting temperature may be of the order of 180° C., while this melting temperature may be of the order of 210° C. when the meltable balls 16a, 16b are made from SnAgCu, or 130° C. when the meltable balls 16a, 16b are made from InSnPb.

The supports 1 and 100 may also be assembled such that apart from the meltable balls 16a, 16b being brought in contact with the conducting pads 126a, 126b, a top face of the first support 1 is also brought into contact with a top face of the second support 100. Thus, there is no space between the top face of the first support 1 and the top face of the second support 100. Therefore an underfill material usually used to fill such a type of space is not necessary in this case. The top face of the second support 100 is located at the opening 15 of the holes 11a, 11b. Assembly of the supports 1 and 100 may thus be arranged such that the top face of the second support 100 located at the opening 15 can close the holes 11a, 11b in which the conducting balls 16a, 16b are placed. In the example in FIG. 1D, the top face of the first support 1 is at least partially formed by the second substrate 12.

A variant embodiment shown in FIGS. 2A-2B, 3 and 4 includes the use of an additional stress attenuation layer 31 between the first support 1 and the second support 100.

This stress attenuation layer 31 is capable of limiting any deformations resulting from differential expansion of materials of the first support 1 relative to materials of the second support 100 during the thermocompression step. The stress attenuation layer 31 is preferably made from a material 32 with a coefficient of thermal expansion (CTE) similar to the CTE of the top face of the first support 1 and the top face of the second support 100 and is preferably intermediate between the CTE of the top face of the first support 1 and the CTE of the top face of the second support 100.

The material 32 may also be chosen to have a low Young modulus, particularly less than 1 GPa.

The material 32 may also be chosen for its resistance to temperatures for example between 100° C. and 200° C.

The layer 31 may for example be made from polymer such as an epoxy-type polymer with a thickness for example between 10 μm and 100 μm.

Figure 2A:
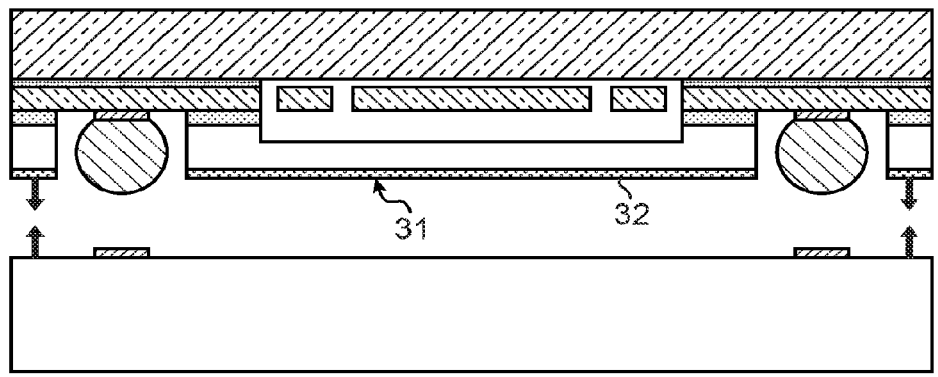
FIGS. 2A-2B show particular example embodiments of the method in which a stress attenuation layer is formed on the first support ready for assembly with the second support.

In the example embodiment shown in FIG. 2A, the layer 31 may for example be formed on the face of the second substrate comprising the blind holes, for example by rolling, before assembly with the second support 100. The layer 31 is then brought into contact with the top face of the second support 100. This layer 31 is preferably applied on the first support 1 before the meltable balls 16a, 16b are made. The material 32 of the additional stress attenuation layer 31 may be a photosensitive polymer that is structured using a photolithography technique.

Figure 2B:
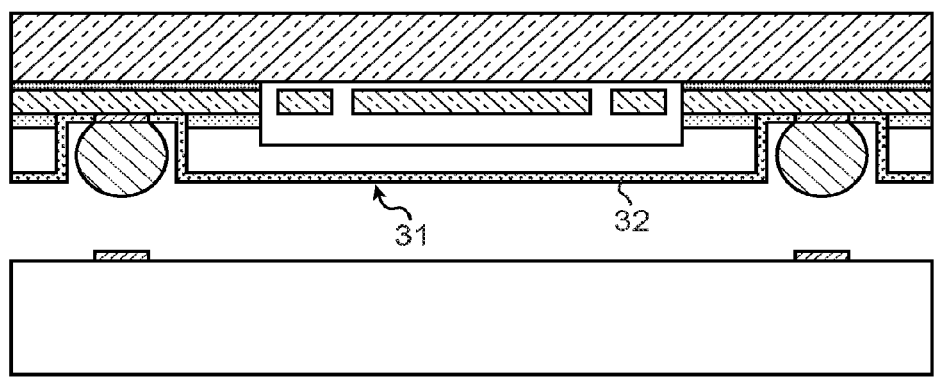

The layer 31 in FIG. 2B is advantageously formed on the face of the second substrate comprising the blind holes 11a, 11b for example by rolling and photolithography such that the layer 31 covers the entire surface of the blind holes except at the contact zones 6a and 6b. When the layer 31 is also made from an electrically insulating material, it performs an electrical insulation function between the meltable balls 16a, 16b and the walls of the blind holes.

Figure 3:
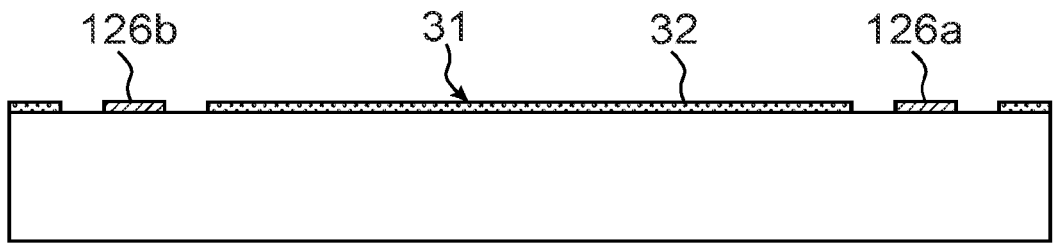
FIG. 3 shows a variant embodiment in which the stress attenuation layer is formed on the second support.

Another example embodiment shown in FIG. 3 advantageously has the stress attenuation layer 31 formed on the face of the second support 100 comprising the conducting pads 126. In general, the stress attenuation layer 31 may be formed on the support with the least relief or roughness.

Figure 4:
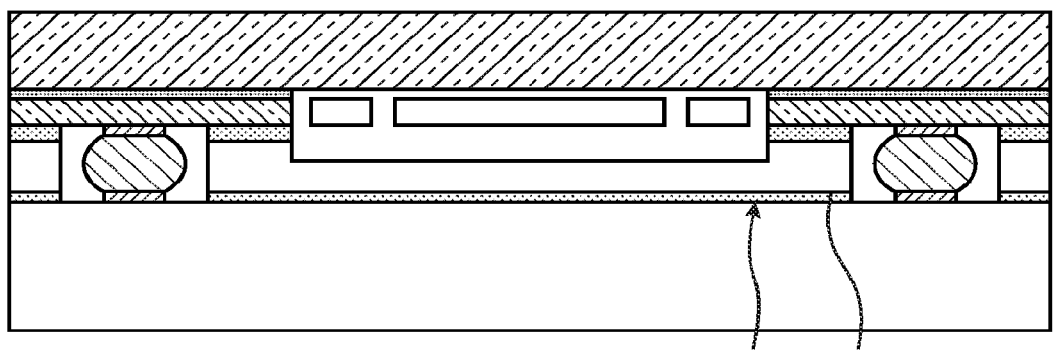
FIG. 4 shows the assembly between the first support and the second support with the intermediate attenuation layer.

FIG. 4 shows an assembly between the first support 1 and the second support 100 with the stress attenuation layer 31 formed between the two.

A MEMS component support is assembled with another support in each of the example embodiments that have just been described above.

The method may also be applied to an assembly of other types of electronic elements comprising electrical connections, for example a NEMS (NanoElectroMechanical System), a MOEMS (Micro Optical ElectroMechanical System), an imager, or a MOS circuit.

The method may also be applied to collective manufacturing in which a first support with a plurality of chips or electronic elements or components is assembled with a second support provided with contact zones.

Once the assembly has been made, the assembled structure may be cut into several elements.

For example, FIG. 5 shows the first support 1 on which there are several MEMS components $10_1$, $10_2$, $10_3$, assembled and connected to electronic circuits $110_1$, $110_2$, $110_3$ of the second support 100 respectively, before cutting the assembly into several elements (the cut planes are shown in FIG. 5 with discontinuous lines), each element being provided with an assembled component connected to an electronic circuit.

The example embodiments that have just been described consist of an assembly with one conducting ball in each blind hole. The number of balls per blind hole is not limited.

Figure 6:
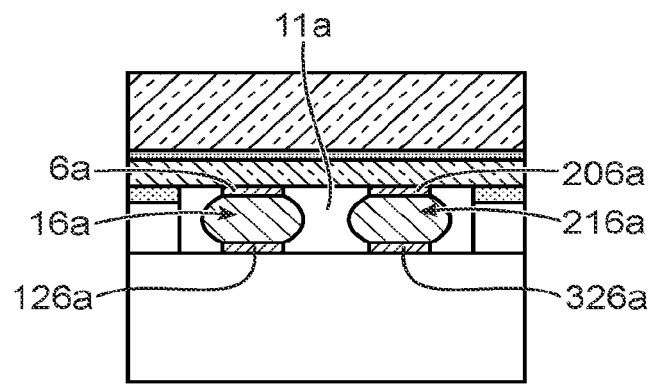
FIG. 6 shows a variant embodiment in which there are several conducting balls and zones in one blind hole.

FIG. 6 shows a variant embodiment in which the blind hole 11a formed in the first support 1 comprises several distinct contact zones 6a, 206a that are not in contact with each other. Each conducting zone 6a, 206a placed on a region of the bottom of this blind hole 11a partially covers this bottom. The conducting contact zones 6a, 206a are located at a non-zero distance from the side walls of the hole. Meltable balls 16a, 216a made from a metallic material are placed on the conducting contact zones 6a, 216a respectively. The meltable balls 16a, 216a may also be at a spacing from each other and brought into contact with a conducting pad 126a and another conducting pad 326a respectively on the second support 100.

The invention claimed is:

1. A method for making a device including a structure comprising a first support assembled to a second support, the second support being also electrically connected to the first support, the method comprising steps consisting of:
    a) depositing a meltable ball on at least a first conducting zone located at the bottom of a blind hole formed on a first face of a first support, the blind hole being delimited by the bottom, one or several side walls, and an opening, the meltable ball having appropriate dimensions relative to the dimensions of the blind hole such that the deposited meltable ball projects above the opening of the blind hole and is located at a distance $\Delta$ from the side walls of the blind hole,
    b) assembling the first support with a second support by thermocompression, by transferring the meltable ball onto a second conducting zone located on a first face of the second support, the transfer being made such that the first face of the second support is located at the opening of the blind hole, the transfer also being made at a temperature at which the meltable ball can be partially melted and the meltable ball compressed by a compression process, the meltable ball having appropriate dimensions relative to the dimensions of the blind hole such that once the first face of the second support is located at the opening of the blind hole, after the compression process is completed the compressed meltable ball makes no contact with the sidewalls and is held at a distance $\Delta'$ from the side walls of the blind hole, such that $\Delta>\Delta'>0$, wherein a stress attenuation layer is formed between a top surface of the first support and a top surface of the second support, with a coefficient of thermal expansion of the stress attenuation layer being intermediate between a coefficient of thermal expansion of the top surface of the first support and a coefficient of thermal expansion of the top surface of the second support.

2. The method according to claim 1, wherein the bottom of the blind hole is partially covered by the first conducting zone, the first conducting zone not being in contact with the side walls of the blind hole.

3. The method according to claim 1, wherein the first support comprises at least one MEMS or NEMS.

4. The method according to claim 3, wherein the first face of the first support comprises an encapsulation cap for the MEMS or NEMS.

5. The method according to claim 1, wherein the second support comprises at least a device chosen from among an ASIC circuit, an electronic board, an MEMS, a NEMS, a memory.

6. The method according to claim 1, wherein the stress attenuation layer is formed before step b) on the first support.

7. The method according to claim 1, wherein the stress attenuation layer is formed on the second support before step a).

8. The method according to claim 1, further comprising at least one step to cut the assembly into several elements after step b).

9. The method according to claim 1, wherein the side walls of the blind hole are made of a conducting material.

* * * * *